United States Patent [19]

Henley

[11] Patent Number: 5,157,327

[45] Date of Patent: Oct. 20, 1992

[54] METHOD AND APPARATUS FOR ELECTRO-OPTICALLY MEASURING A VOLTAGE SIGNAL

[75] Inventor: Francois J. Henley, Los Gatos, Calif.

[73] Assignee: Photon Dynamics, Inc., Milpitas, Calif.

[21] Appl. No.: 585,586

[22] Filed: Sep. 19, 1990

[51] Int. Cl.$^5$ .............................................. G01R 19/00
[52] U.S. Cl. .................................. 324/158 R; 324/74; 324/96
[58] Field of Search .............. 324/158 R, 158 D, 73.1, 324/96, 74, 77 K; 356/294, 243, 397, 239; 350/390, 331; 359/245, 246, 249

[56] References Cited

U.S. PATENT DOCUMENTS

| | | | |
|---|---|---|---|
| 4,242,635 | 12/1980 | Burns | 324/96 |
| 4,355,278 | 10/1982 | Burns et al. | 324/96 |
| 4,862,075 | 8/1989 | Choi et al. | 324/96 |
| 4,868,492 | 9/1989 | Beha et al. | 324/158 R |
| 4,875,006 | 10/1989 | Henley et al. | 324/96 |
| 4,975,635 | 12/1990 | Takahashi et al. | 324/96 |
| 4,999,577 | 3/1991 | Beha et al. | 324/158 R |
| 5,034,683 | 7/1991 | Takahashi et al. | 324/73.1 |

OTHER PUBLICATIONS

Henley, Francois J., "Electro-Optic Technology Supports Gigahertz Speeds", *Electronics Test*, Sep., 1988.
McCarty, Lyle H., "System Tests Devices at GHz Rates", *Design News*, Apr. 10, 1989.
Novellino, John, "Electro-Optic Device Tester Tops 1 GHz", *Electronic Design*, Sep. 8, 1988.
Henley, Francois J., "An Ultra High Speed Test System", *IEEE Design & Test of Computers*, Feb., 1989.
Henley, Francois J., "Using Electro-Optic Sampling Technology for Accurate Gigahertz Ate: Overview of the Art", *1990 IEEE VLSI Test Sumposium*.
Kratzer, et al., "High-Speed Pattern Generator and GaAs Pin Electronics for a Gigahertz Production Test System", *Proceedings of IEEE 1988 International Test Conf.*, Sep., 1988.
Henley, F. J., et al., "Test Head Design Using Electro-Optic Receivers and GaAs Pin Electronics for a Gigahertz Production Test System", *Proceedings of IEEE 1988 International Test Conference*, Sep., 1988.
Henley, F. J., et al., "Achieving ATE Accuracy at Gigahertz Test Rates: Comparison of Electronic and Electro-Optic Sampling Technologies", *International Test Conference*, Aug., 1989.
Henley, F. J., et al., "Systems Solutions Based on Electro-Optic Sampling to High Speed IC Test Problems", *SPIE*, vol. 795.
Barton, S., "Characterization of High-Speed (Above 500 MHz) Devices Using Advanced ATE-Techniques, Results & Device Problem" *Proceedings of the IEEE International Test Conf.*, Aug. 1989.

*Primary Examiner*—Vinh Nguyen
*Attorney, Agent, or Firm*—Townsend and Townsend

[57] ABSTRACT

A method and apparatus for measuring an electro-optic voltage signal generated in response to an applied voltage signal at a select dot contact of an electro-optic crystal. The applied voltage signal is time averaged along one path to generate an average reference voltage signal, and electro-optically measured along another path to provide a corresponding electro-optic voltage signal. The electro-optic system is fine offset calibrated during a run, with the electro-optic voltage signal measured after the calibration. During the fine offset calibration, the electro-optic voltage signal and the average reference voltage signal are input to an integrator generating a responsive offset signal. The timing correlation between the applied voltage signal the electro-optic voltage signal is randomized during this calibration so that the generated electro-optic voltage signal is an average. The feedback forces the electro-optic signal to the average reference voltage signal level. Upon stabilization, the offset signal is locked in as the calibrated fine offset signal and the timing between the applied voltage and electro-optically measured voltage signals is restored. The applied voltage signal then is sampled to generate the electro-optically measured voltage signal.

21 Claims, 5 Drawing Sheets

METHOD AND APPARATUS FOR ELECTRO-OPTICALLY MEASURING A VOLTAGE SIGNAL

CROSS REFERENCE TO RELATED APPLICATION

This invention is related to the commonly-assigned U.S. patent application Ser. No. 07/481,429 filed Feb. 15, 1990 for VOLTAGE IMAGING SYSTEM USING ELECTRO-OPTICS and the commonlyassigned U.S. Pat. No. 4,875,006, issued Oct. 17, 1989 for ULTRAHIGH-SPEED DIGITAL TEST SYSTEM USING ELECTRO-OPTIC SIGNAL SAMPLING. The contents of that application and patent are incorporated herein by reference and made a part hereof.

BACKGROUND OF THE INVENTION

This invention relates to a method and apparatus for electro-optically measuring a voltage signal, and more particularly to a method and apparatus for electro-optically measuring a voltage signal to dc accuracy by performing a runtime fine offset calibration in which the measured signal is referenced to an electrical average of the voltage signal. The voltage signal then is measured with the calibrated system.

The increase in integrated circuit speeds enabled by advances in ECL and GaAs technologies has created a need for faster test systems which can test devices based upon such technologies by providing test data signals at speeds up to the gigahertz range with excellent timing accuracy. Obtaining dc accurate measurements of response patterns to such test data signals has proven difficult.

Electro-optic test systems typically use synchronous detection techniques such as AC coupling to measure the response signals for high speed test data signals. Such techniques have not been able to provide dc accurate measurements of instantaneous voltage levels due to drifting offsets in the electro-optic system.

In an electro-optic system including an array of light refracting crystals and electro-optic sensors, calibration of the system is achieved using look-up tables to store compensating offsets for the various crystals. Thermal and mechanical effects on a crystal, however, cause stressinduced birefringence causing the needed offsets to drift. As a result, the offsets in the look-up table may become inaccurate or skewed over time. When trying to measure instantaneous dc response levels, or signals levels to extremely accurate timing constraints, the changing offset becomes significant. As a result, the measurement of electro-optic signal levels to dc accuracy at extreme timing accuracies has been a difficult long standing problem. Typical AC coupling techniques do not achieve such accuracy.

Accordingly, there is a need for an electro-optic system which can accurately measure a voltage signal at dc accuracy. Such ability is desireable for applications including, but not limited to, multi-channel oscilloscopes, voltage imaging systems and testing of high speed integrated circuit devices.

An electro-optic voltage imaging system created in part by the inventor has been described at: (1) "Electro-Optic Technology Supports Gigahertz Speeds" by Francois J. Henley, *Electronics Test*, September 1988; (2) "System Tests Devices at GHz Rates" by Lyle H. McCarty, *Design News*, Apr. 10, 1989(3) "Electro-Optic Device Tester Tops 1 GHz" by John Novellino, *Electronic Design*, Sep. 8, 1988; and (4) "An Ultra High Speed Test System" by Francois J. Henley, *IEEE Design & Test of Computers*, February 1989.

An electro-optic test system block diagram is discussed at "Using Electro-Optic Sampling Technology For Accurate Gigahertz ATE: Overview of the Art" by Francois J. Henley, published 1990 *IEEE VLSI Test Symposium*. A high speed pattern generator for the test system is described at "High Speed Pattern Generator and GaAs Pin Electronics for a Gigahertz Production test System" by Dean J. Kratzer, Steve Barton, Francois J. Henley and David A. Plomgrem, *Proceedings of IEEE* 1988 *International Test Conference*, September 1988. A test head design for an electro-optic test system is described at "Test Head Using Electro-optic Receivers and GaAs Pin Electronics for a Gigahertz Production test System" by Francois J. Henley and Hee-June Choi, *Proceedings of IEEE* 1988 *International Test Conference*, September 1988.

Other related publications include (1) "Achieving ATE Accuracy at Gigahertz Test Rates: Comparison of Electronic and Electro-Optic Sampling Technologies" by Francois J. Henley and Hee-June Choi, presented at the International Test Conference, August 1989; (2) "Systems Solutions Based on Electro-optic Sampling to High Speed IC Test Problems" by Francois J. Henley and Douglas B. MacDonald, published SPIE Vol. 795 *Characterization of Very High Speed Semiconductor Devices & Integrated Circuits* (1987). pp. 345–351; and (3) "Characterization of High Speed (Above 500 MHz) Devices Using Advanced ATE—Techniques, Results and Device Problems" by Steve Barton, Proceedings of the IEEE 1989, International Test Conference, August 1989.

SUMMARY OF THE INVENTION

According to the invention, an electro-optic voltage signal is measured with excellent timing and signal level accuracy for signals in the gigahertz range by performing a run-time fine offset calibration of the electro-optic measurement system, then measuring the signal with the calibrated system. The fine offset calibration references the measured signal to an electrical average of the applied signal to eliminate drift errors. A plurality of such signals are measured by fine offset calibrating the system and measuring the signal for each of the plurality of signals.

In accordance with the invention, an electro-optic crystal having a plurality of metallic dot contacts is coupled to a device under test (DUT). The DUT receives a plurality of test data signals at various input pins and generates in response a plurality of voltage signals at various output pins. The DUT pins are electrically coupled to respective dot contacts of the crystal. As a result, the response signals at the various output pins are applied to the corresponding dot contacts. In addition, the response signals and test data signals are applied to an average referencing circuit.

To measure the response signals, a response signal is repeatedly sampled to form the response over the duration of a repeating test pattern. Prior to measuring the response, the electro-optic system is fine offset calibrated for the dot contact coupled to the select response signal.

During a fine offset calibration, the response signal is selected by the average referencing circuit and the corresponding dot contact is sampled by the electro-optic voltage measurement system. The average reference circuit generates a reference signal which is compared to the electro-optically sampled response signal. Successive samples of the response signal form an average signal during the calibration so that the electro-optically measured average signal is compared to the average reference signal. For the electro-optically measured response signal to form an average, the timing between the application of test signals to the various pins of the DUT and the sampling of the response signal is randomized.

The electro-optically measured average voltage signal is generated at a correlated double sampling amplifier. The electro-optically measured average signal and the average reference signal are input to an integrator which generates an offset signal fed back into an offset input of a correlated double sampling amplifier. Thus, a feedback loop is formed between the amplifier and the integrator which forces the electro-optically measured average voltage signal to the average reference signal. Upon stabilization of the loop, the offset signal generated is the calibrated fine offset. The calibrated fine offset then is locked in as the amplifier offset signal by switching a sample and hold device from a sample mode to a hold mode.

The timing between the test vectors and the sampling of responses then is restored, so that the electro-optically measured signal is no longer an average signal, but is an instantaneous voltage measurement of the selected response signal. The response signal then is measured by repeatedly sampling the signal at various times during the test pattern. Each sample provides a dc accurate measurement of an instantaneous voltage signal at the sampled dot contact.

For measuring other response signals at other dot contacts, a fine offset calibration and measurement process is performed for each additional response signal to be measured. Accordingly, an unknown voltage signal of high frequency applied to a dot contact of an electro-optic crystal may be measured with excellent timing to dc accuracy.

The electro-optic measurement apparatus according to this invention includes an electro-optic crystal, an optics system, a correlated double sampling amplifier, an integration circuit, a sample and hold circuit, an average referencing circuit, and a system controller. A compensation crystal for applying a coarse offset to the electro-optic system also is provided. The dot contacts are configured on one surface of the electro-optic crystal. Each dot contact includes a reflective surface for reflecting a laser beam. The dot contact reflects the laser beam altering the polarization of the beam in proportion to the voltage level applied to the contact. The laser beam is reflected back through the optics system to an analyzer and a correlated double sampling amplifier to generate the electro-optic voltage signal in proportion to the polarization of the reflected laser beam.

The average reference circuit includes a network of high impedance resistor channels coupled to a multiplexing device. The multiplexing device selects the channel which receives the same voltage signal as the sampled dot contact. An averaging device such as an RC network is coupled to the output of the multiplexing device to generate an averaged reference signal.

DETAILED DESCRIPTION OF A PREFERRED EMBODIMENT

System Overview

Figure 1:
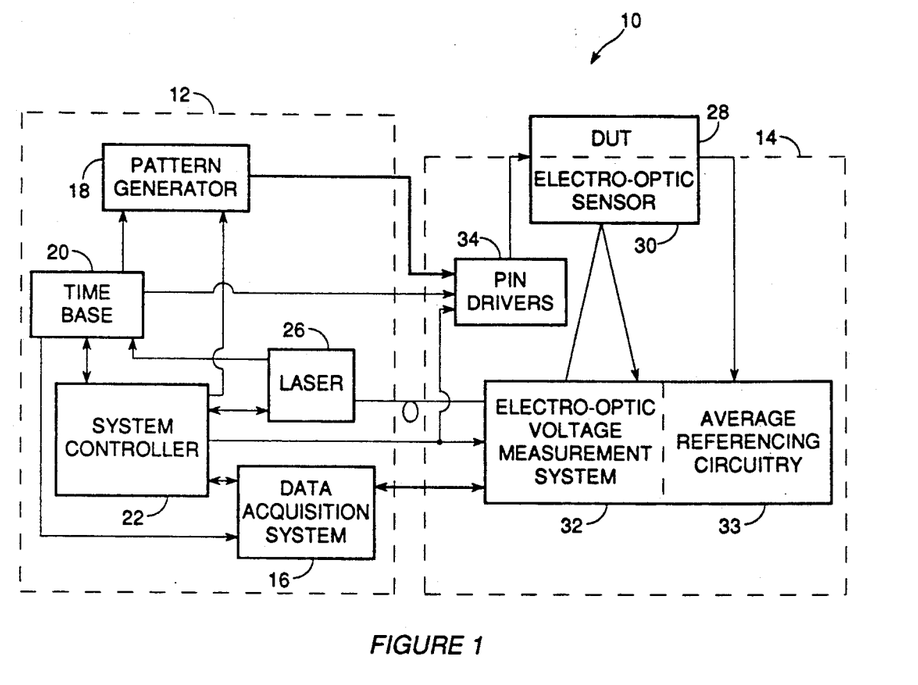
FIG. 1 is a block diagram of an electro-optic test system.

Referring to FIG. 1, a block diagram of an electro-optic test system 10 is shown including a main system unit 12 and a test head 14. A voltage imaging system for such a test system is described in the commonly assigned related U.S. patent application Ser. No. 07/481,429 filed Feb. 15, 1990 for VOLTAGE IMAGING SYSTEM USING ELECTRO-OPTICS and the commonly-assigned U.S. Pat. No. 4,875,006, issued Oct. 17, 1989 for ULTRAHIGH-SPEED DIGITAL TEST SYSTEM USING ELECTRO-OPTIC SIGNAL SAMPLING. The contents of that application and patent are incorporated herein by reference.

Referring again to FIG. 1, the main system unit 12 includes a data acquisition system 16, a high speed pattern generator 18, a system time base 20, a system controller 22, and a continuous-wave mode-locked Nd:Yag laser 26.

The pattern generator 18 stores test data vectors, and during testing, sends the data signals to the test head 14 which time multiplexes the signals to the pins of a device under test (DUT) 28. The time base 20 defines the timing of the pattern generator transmissions and the application of the data signals to the DUT pins. The laser 26 is a continuously pulsing laser source. According to the preferred embodiment, the laser 26 has a high Q, generates pulses with an 80 to 100 picosecond pulse width, and uses a 76 MHz optical oscillator.

The test head 14 includes an electro-optic sensor crystal 30, an electro-optic voltage measurement system 32, the average referencing circuit 33, and pin drivers 34. The test vectors are applied to the pins of the DUT 30 through the pin drivers 34 which multiplex the signals up in the time domain allowing data to be transferred to the test head 14 at a lower rate than that at which it is transferred to the DUT 30.

Figure 2:
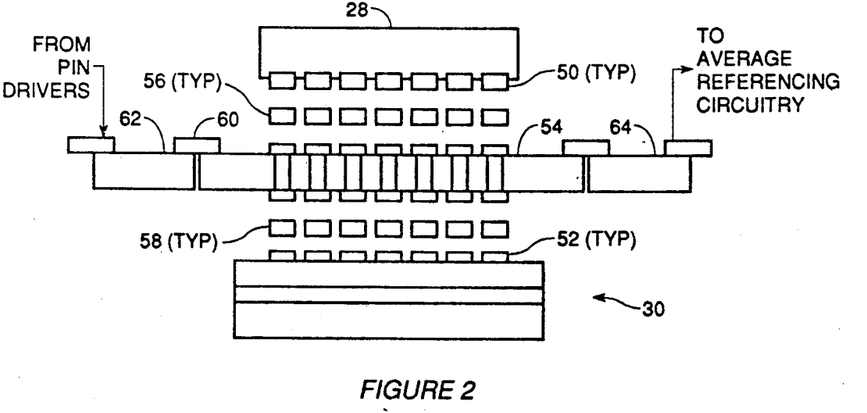
FIG. 2 is an exploded view of the interface between the electro-optic sensor and the device under test for the system of FIG. 1.

Referring to FIG. 2, the DUT environment is shown in an exploded view. The DUT 28 includes a plurality of pins 50 which are electrically coupled to respective dot contacts 52 of the electro-optic sensor 30 through a DUT board 54 and elastomers 56, 58. The DUT board 54 is configured to couple to the DUT pins 50 through the elastomers 56, and to the dot contacts 52 through the elastomers 58. A metal over elastomer (MOE) ring 60 concentrically surrounds the DUT board 54 providing electrical coupling to a connector 62 carrying signals from the pin drivers 34 and to a connector 64 carrying signals to the average referencing circuit 33.

Figure 3:
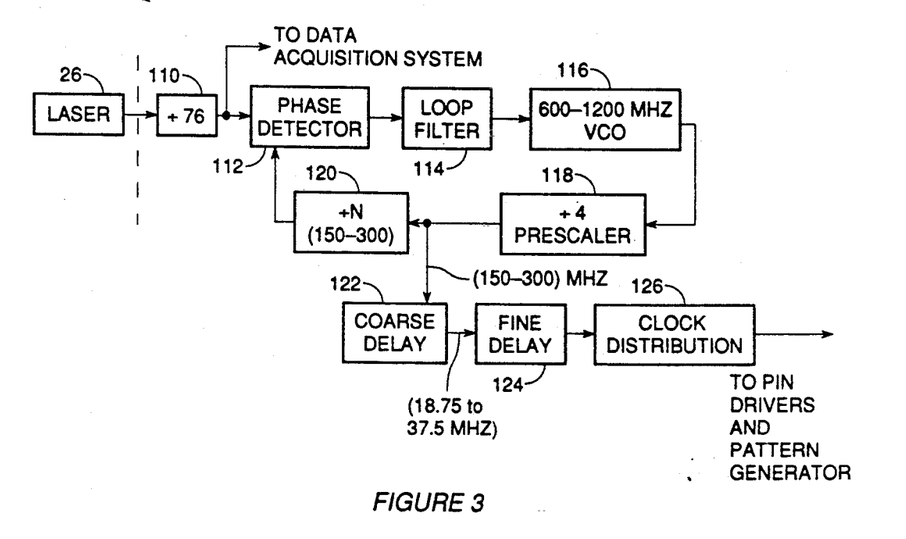
FIG. 3 is a block diagram of the time base of FIG. 1.

Referring to FIG. 3, a block diagram of the time base is shown in which a detected laser pulse from the laser 26 is input to the time base 20. The time base 20 is a phase-locked loop frequency synthesizer referenced to the laser pulse outputs. The input stream of laser pulses is divided by 76 at divider 110, for the 76 MHz laser embodiment, generating a 1 MHz clock signal for the data acquisition system 16. The 1 MHz signal is input to a phase-locked loop formed by phase detector 112, loop filter 114, 600-1200 MHz voltage controlled oscillator (VCO) 116, divide-by-4 prescaler 118 and divide-by-N divider 120. The bandwidth of the phase-locked loop is large enough that the free running VCO 116 phase noise is suppressed by the feedback action of the loop, yet is limited so as to maintain loop stability and sideband suppression.

The output of the phase locked loop is a 150 to 300 MHz signal as defined by the divide-by-N divider 120. The division interval of the N divider 120 is set by the system controller 22. The phase-locked loop output signal passes through a coarse delay 122 which divides the signal by 7, 8 or 9 to generate an 18.75 MHz to 37.5 MHz signal input to a fine delay 124.

The coarse delay 122 is a divide by 8 counter with swallow and expel capabilities. Pulse swallowing (divide by 9) results in sampling four VCO clock cycles earlier in the pattern. Pulse expelling (divide by 7) results in sampling four VCO clock cycles later in the pattern. The controller 22 selects the normal, swallow or expel mode of the course delay 122.

The maximum coarse delay for the embodiment described is 6.67 nano-seconds (four 600 MHz clock cycles). The fine delay 124 is used to interpolate quantized steps within the coarse delay. The output of the fine delay leads to a clock distribution circuit 126 for routing the time base output to the pin drivers 34 and the pattern generator 18.

Figure 4:
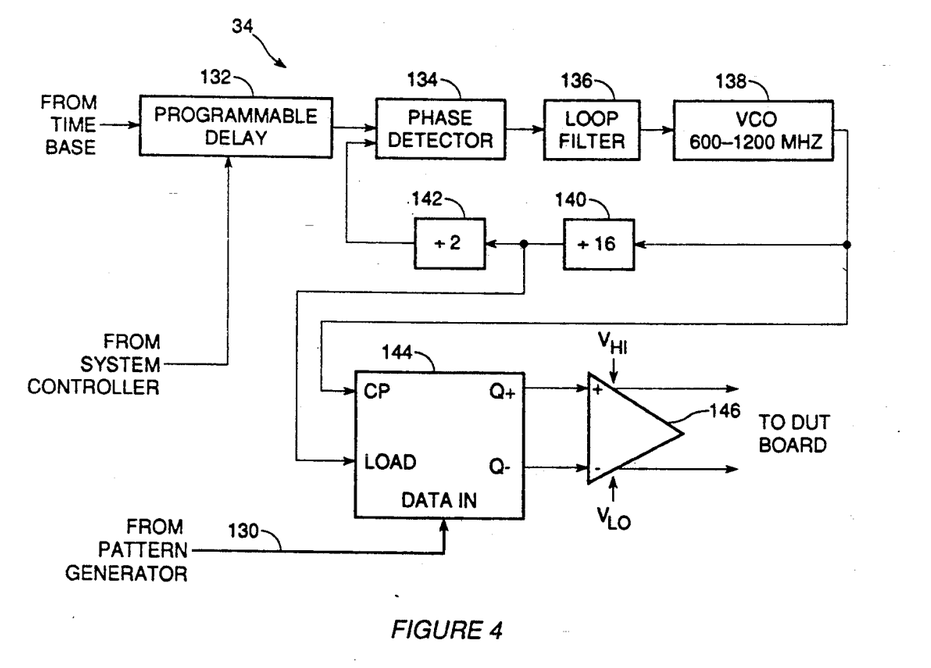
FIG. 4 is a block diagram of a pin driver of FIG. 1.
Figure 5A:
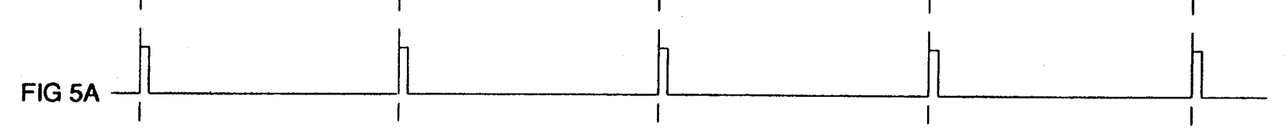
FIGS. 5 are relative timing diagrams for the laser pulse reference, the time base clock signal, and the test vector data stream as output to the device under test.
Figure 5B:
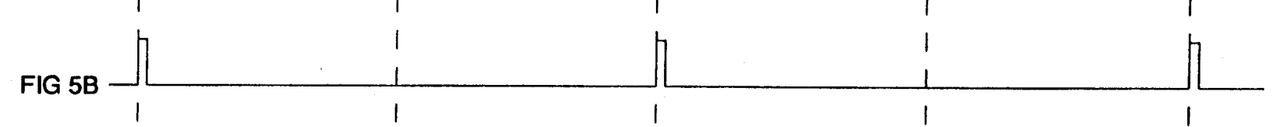
Figure 5C:
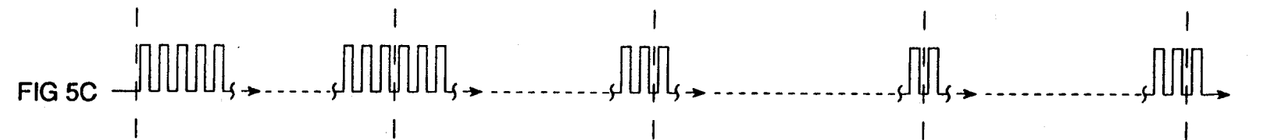
Figure 5D:
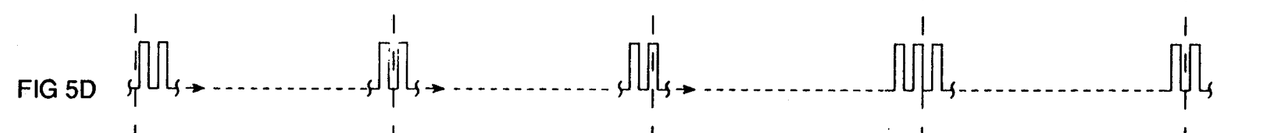

Referring to FIG. 4, a block diagram of a pin driver 34 is shown. A pin driver 34 is used to apply a sequence of test vectors to a pin of the DUT 28. The pin driver 34 receives a 16 bit, 37.5 MHz to 75 MHz data stream 130 from the pattern generator 18 and outputs, based upon such data stream, a 1200 Megabyte per second (MB/s) data signal. A plurality of pin drivers provide data signals to various DUT input pins. Over time the data signals are repeated forming a repeating test pattern.

An 18.75 to 37.5 MHz clock signal from the time base 20 enters the pin driver 34 at a programmable delay element 132. The delay of element 132 is defined by the system controller 22. The programmably delayed clock signal enters a phase-locked loop formed from a phase detector 134, loop filter 136, 600 to 1200 MHz voltage controlled oscillator (VCO) 138, divide-by-16 divider 140 and divide-by-2 divider 142. The programmably delayed clock signal enters the phase locked loop at one input of the phase detector 134. The other input of the detector 134 receives a divided-by-32 signal feedback from the VCO 138. The detector 134 compares the frequency and phase of the divided-by-32 signal to that of the programmably delayed clock signal. The resulting error signal output is filtered by filter 136 to form a dc tuning voltage for the VCO 138.

The VCO 138 operates over the frequency range 600 to 1200 MHz, i.e. 32 times the frequency bounds of the clock signal input from the time base 20. The VCO 138 output is input as a clock signal to a 16 bit parallel to serial shift register 144. The divide-by-16 pulse is input to register 144 as a load signal. The 16 bit data stream 130 from the pattern generator is converted to serial data by the register 144 and output at the Q+ and Q− outputs. In each group of 16 clock pulses, one parallel load followed by 15 serial shifts is performed. While the data is being shifted, the pattern generator 18 provides the next 16 bits of data to be shifted. Accordingly, the data transfer from the pattern generator 18 to the pin driver 34 is slower than that at which the data is applied to the DUT pins 50. For a DUT pin signal path having a 50 ohm characteristic impedance, the applied voltage signal has rise and fall times of approximately 110 picoseconds.

Referring to FIG. 5, respective timing diagrams are shown. FIG. 5a shows the time reference, i.e. timing of the laser pulses. The laser 26 generates pulses at a 76 MHz rate to form the timing reference for the system 10. As discussed above, the time base 20 produces an 18.75 to 37.5 MHz signal referenced to the laser 26. FIG. 5b shows a 37.5 MHz time base clock output for driving the pattern generator 18 and the pin drivers 34. The pin drivers 34 as described generate a data stream of test vectors to the DUT pins at up to 1200 MB/s. FIG. 5c shows the data stream relative to the laser and time base clock. As shown, the first test vector following a laser pulse is offset from the laser pulse by a fixed delay. This delay corresponds to the delay set at the programmable delay 132. During a fine offset calibration this delay is randomized (see FIG. 5d).

Sampling Methodology

During testing, a test pattern of test vectors is applied to the input pins 50 of the DUT 28 and repeated continuously. As described, a test vector corresponds to a signal at a particular DUT pin 50. The DUT 28 generates a set of response signals at DUT output pins 50 in response to the test pattern. The response signals are respective response vectors forming a response pattern. The DUT output pins 50 are sampled electro-optically during the repeating test pattern to measure the response signal at each of the output pins.

The test system measures the response pattern by sampling the response vectors, repeatedly. The test head response vector sampling rate is the frequency of the divided laser source (i.e. 1 MHz). The data rate of test vectors applied to the DUT pins 50 is faster, however, meaning that a number of test vectors are sent between samples of a response vector.

To sample the response vector over the entire test pattern, the response vector is sampled by the electro-optic measurement system 32 repeatedly, each sample occurring during a different point in the test pattern until responses for numerous or all points are gathered. The timing between the generation of test vectors and the sampling is correlated so that the response can be taken for varying points in the test pattern. This correlation is achieved by fixing the programmable delay 132 to a select value. Prior to such measurement, however, a fine offset calibration is performed.

During the fine offset calibration, the select response vector is sampled repeatedly, but the correlation between the test vector timing and the E-O sampling is randomized. This results in the electro-optically measured voltage being an average voltage response over the entire test pattern, rather than an instantaneous voltage signal response for a particular point in the test pattern. Upon completion of the fine offset calibration, the correlation is restored and the response vector sampled repeatedly to measure the response signal. The next response vector then is sampled, first undergoing a fine offset calibration, then the measurement. Each response vector is measured in turn to develop the response pattern.

The process of randomizing the timing correlation to detect the response vector as an average signal is referred to as a spin process. Randomizing the correlation between the E-O sampling and the application of test vectors, in effect, is a "spinning" of the electro-optic system relative to the application of test vectors.

E-O Measurement System and Average Referencing Circuit

Figure 6:
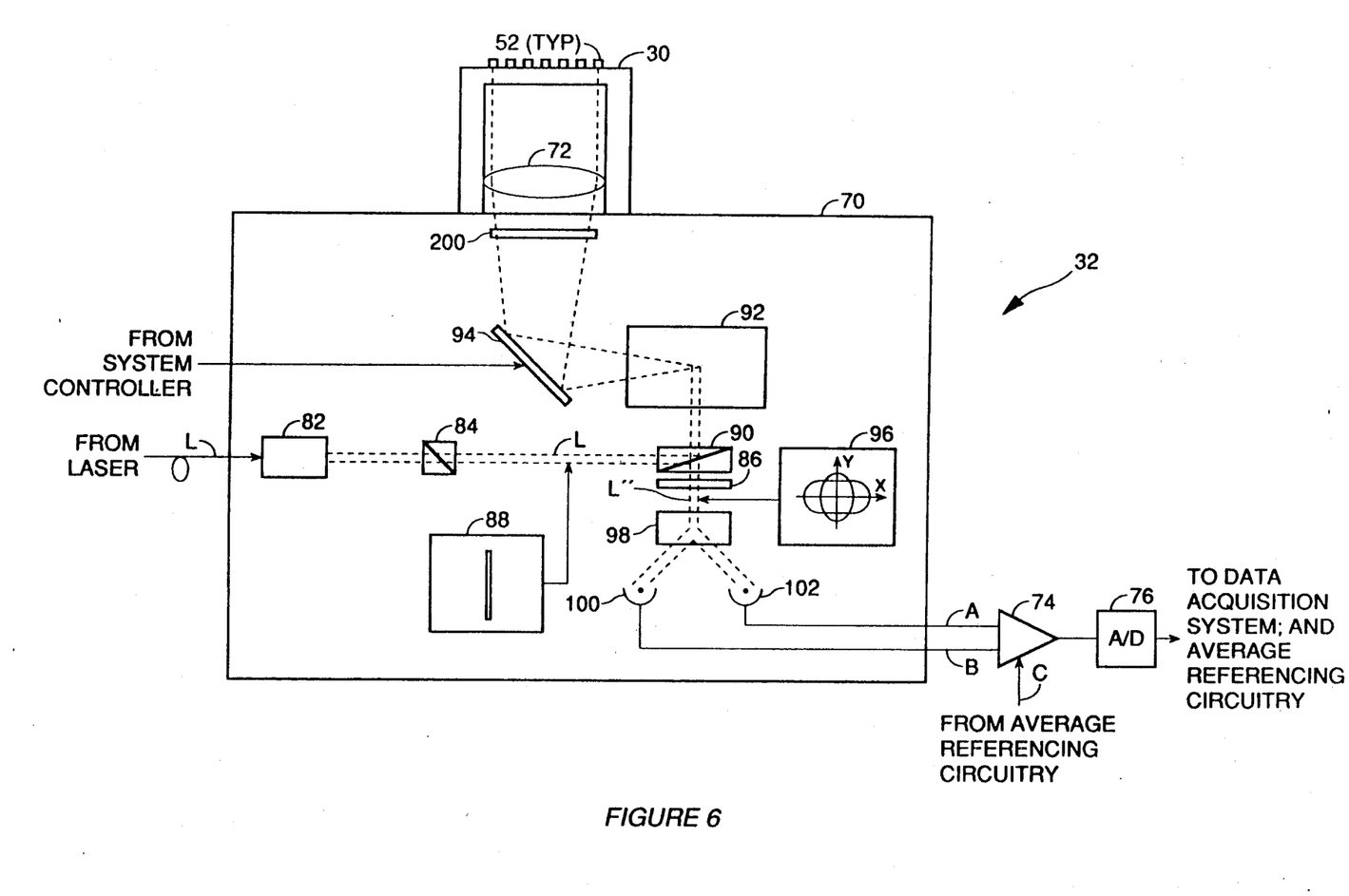
FIG. 6 is a block diagram of the electro-optic voltage measurement system of FIG. 1.

Referring to FIG. 6, a block diagram of the electro-optic voltage measurement system 32 is shown including an optics system 70, a scanning lens 72, a compensator crystal 200, a correlated double sampling amplifier (CDS) 74, and an A/D converter 76. The electro-optic sensor crystal 30 also is shown. The laser source 26 generates a beam L of laser pulse which is fed into fiber collimator 82, then polarizer 84. The laser beam is linearly polarized at the output of plate 86 as shown at box 88. The linearly polarized beam L' enters a nonpolarizing beam-splitter 90 which directs the beam L' to an X-Y scanner 92. The scanner 92 directs the beam L' to mirror 94 which reflects the beam L' through crystal 200 and lens 72 to the underside of a selected dot contact 52.

Each dot contact 52 has a reflective surface in contact with the crystal 30 for reflecting the laser beam. Each dot contact alters the polarization of the laser beam L' in proportion to the applied voltage signal (i.e. response signal) to which it is exposed. The reflected beam L" returns to the mirror 94 and is directed through the X-Y scanner 92 to the non-polarizing beamsplitter 90 and quarter-wave plate 86. The reflected beam as shown at box 96 is elliptically polarized. The reflected beam L" enters analyzer 98 which divides the beam polarization and detects each polarization at respective detectors 100, 102. One detector 100 measures the polarization along the x axis, while the other detector 102 measures the polarization along the y axis. The detectors 100, 102 generate respective voltage signals A, B which are input to a correlated double sampling amplifier 74. A difference voltage signal is generated, converted from analog to digital format by A/D converter 76, then output to the data acquisition system 16 as the electro-optically measured voltage signal.

Figure 7:
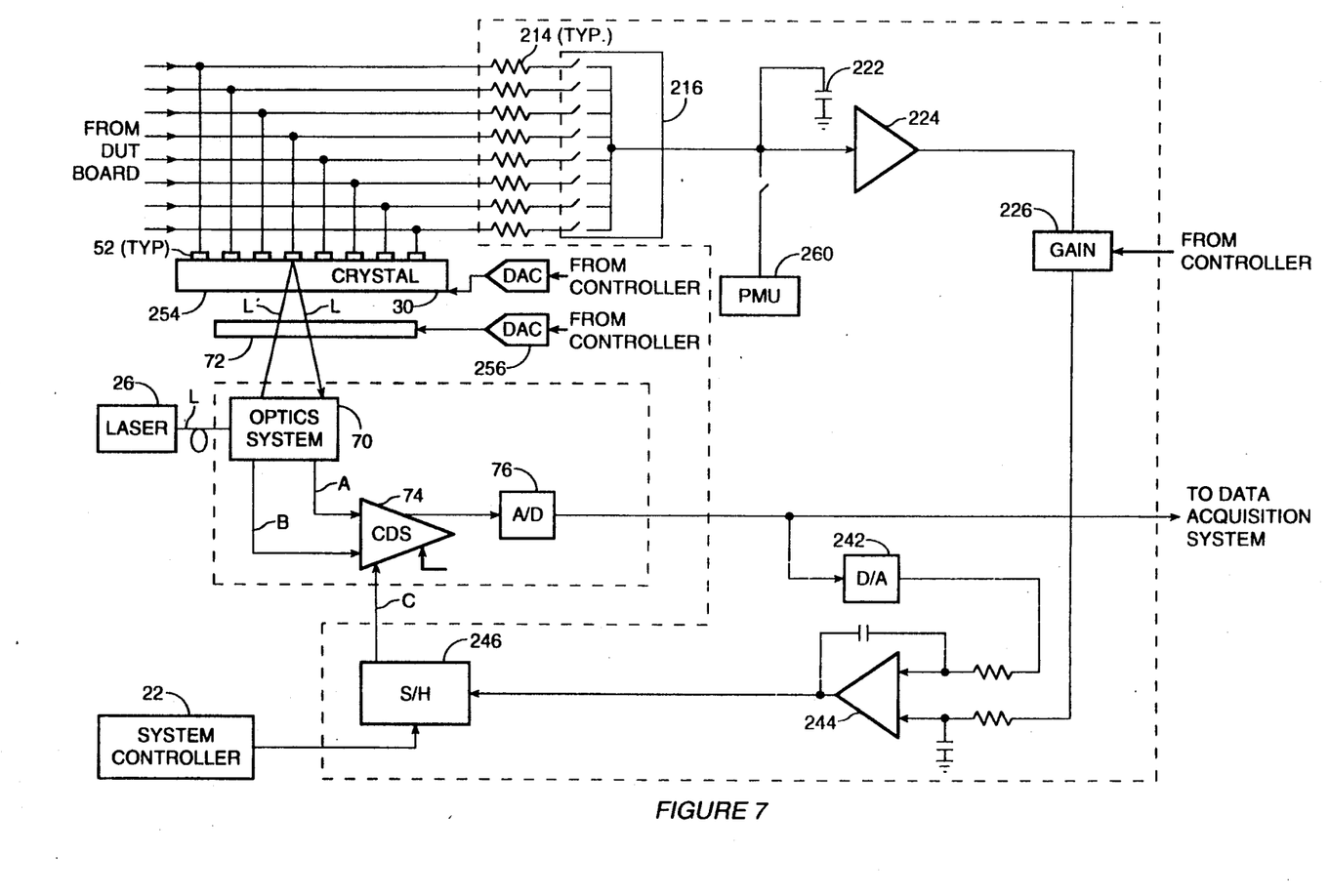
FIG. 7 is a circuit block diagram of the electro-optic measurement system of FIG. 6 along with the average referencing circuit, according to an embodiment of this invention.

Referring to FIG. 7, a circuit block diagram of the electro-optic voltage measurement system 32 and average referencing circuit 33 are shown. Respective response voltage signals, are input to the electro-optic (E-O) measurement system 32 and average referencing circuit 33. The E-O measurement system 32 samples a select response signal to generate a corresponding electro-optically measured voltage signal. The average referencing circuit 33 selects the sampled response voltage signal to generate a corresponding average reference signal.

Referring to the average referencing circuit 33, response voltage signals are input to respective channels, each channel formed by a resistor 214. The resistors 214 are selected to be of high impedance and low inductance relative to the response voltage signal frequency so as not to upset the response voltage signal. For high frequency response voltage signals in the microwave range, for example, 1 kilohm to 10 kilohm low inductance resistors are used.

Each resistor 214 is coupled to a multiplexing device 216. The controller 22 selects the channel passed through the multiplexing device 216 to correspond to the dot contact 52 being sampled. A capacitor 222 is coupled to the output of the multiplexing device 216 to form an RC network which generates a time averaged voltage signal. The average voltage signal is boosted by an amplifier 224, then gain-adjusted at a programmable gain device 226 to generate an average gain-adjusted reference voltage signal.

Referring to the E-O voltage measurement system 32 and electro-optic sensor 30, the array of dot contacts 52 are arranged on the surface of the electro-optic sensor crystal 30. The laser beam passes through the optics system 70 and is directed through the compensator crystal 200 and the electro-optic sensor crystal 30 to a selected dot contact 52. The selected dot contact 52 is determined by the controller 22.

The optics system 70 detects the reflected laser beam L" with the altered polarization (i.e. elliptical) at two differential detectors 100, 102 (i.e. x axis, y axis). The polarization of the reflected beam L" is split by analyzer 98 with each differential detector 100, 102 sensing the beam polarization along a respective axis. One differential detector 102 generates a signal A input to a CDS amplifier 74, while the other detector 100 generates a signal B also input to the CDS amplifier 74. The CDS amplifier 74 generates a difference signal A-B which is proportional to the change in polarization and thus to the voltage signal of the response vector. For a circularly polarized beam L" (i.e. ground) the A and B signals are equal and the difference signal is zero. An offset signal C also is input to the CDS amplifier 74 for calibrating the difference signal.

The difference signal is input to an analog to digital converter 76, then input to the data acquisition system 16 and a digital to analog converter 242. D/A 242 feeds the electro-optically measured voltage signal into one channel of an integration circuit 244. The other channel of the integration circuit 244 receives the average gain-adjusted reference voltage signal. The integrator 244 generates an output signal which is coupled to the offset input C of the CDS amplifier 74 through a sample and hold circuit 246. During a sample mode of the sample and hold circuit 246, a loop is formed forcing the CDS amplifier 74 output to approach the average reference voltage signal. Sample mode is set during a fine offset calibration to close the loop.

To achieve a stable loop, the electro-optically measured voltage is an average signal. As described above, this average E-O signal is achieved by the spin process. The average measured signal is compared to the average reference signal by the integration circuit 244, with the average measured signal being forced to the average reference signal value as the circuit stabilizes. As the measured signal stabilizes, the offset signal output of the integrator 244 also stabilizes. The stable offset signal is the calibrated fine offset.

Upon stabilization the sample and hold circuit 246 is put into the hold mode by the controller 22 locking in the calibrated fine offset as the offset signal C for the CDS amplifier 74. The spin process then is terminated enabling normal measurement of the applied voltage signal.

Start-up Calibrations

Prior to the general operation of the test system 10, the electro-optic measurement system 32 undergoes a system calibration which includes electro-optic calibrations and an average referencing calibration. The electro-optic calibrations include a coarse offset calibration and an electro-optic gain calibration. The average referencing calibration includes a system gain adjustment calibration.

First, the electro-optics calibrations are described. A coarse offset calibration is performed with the applied voltage signal to the dot contacts 52 being at ground, the electrode formed at surface 254 of crystal 30 being at ground and the offset signal C output from the sample and hold circuit 246 being at ground. The difference signal output from the CDS amplifier 74 for each dot contact then is zeroed by adjusting a DAC compensator 256 coupled to the compensator crystal 200 and storing the adjustment value in a look-up table as the coarse offset for the selected dot contact. The process is repeated to generate a coarse offset corresponding to each dot contact 52. This calibration corrects for offset errors in the crystals 30 and 200 and in the optics system 70.

Next, an electro-optic gain calibration for each dot contact is calculated with the respective dot contacts 52 at ground, the electrode formed by surface 254 of crystal 30 at ground, the offset signal C forced to ground and the compensator 256 set with the appropriate coarse offset from the look-up table. The difference signal then is detected as some value $E_0$. The voltage at the surface 254 then is altered, for example, to 5 volts and the difference signal is measured again to detect some value, $E_5$. The electro-optic gain for the selected dot contact $52_n$ then can be derived from the formula:

$$g_n = (0V - 5V) / (E_0 - E_5)$$

where:
$g_n$ = electro-optic gain;
$E_0$ = measured difference signal at 0 Volts;
$E_5$ = measured difference signal at 5 Volts.

The electro-optic gain is calculated and stored in a look-up table for each dot contact.

The average referencing calibration for adjusting the system gain, then is performed. Selecting any dot contact, the dot contact 52 is connected to a ground potential, the electrode at surface 254 is exposed to a ground potential and the corresponding coarse offset is set. The input to amplifier 224 then is set to ground by the precision measurement unit (PMU) 260 and the voltage signal, $E_0$, output from A/D 76 measured. The PMU 260 output to the amplifier 224 then is adjusted to, for example, 10 volts and the difference signal, $E_{10}$, measured. The system gain G then is determined by the formula:

$$G = (0V - 10V) / (E_0 - E_{10})$$

where:
G = system gain;
$E_0$ = measured difference signal at 0 Volts;
$E_{10}$ = measured difference signal at 10 Volts.

The programmable gain device then is programmed with the calculated system gain G.

Run-time Fine Offset Calibration

The preliminary calibrations being complete, the electro-optic system 32 now is ready for normal operation. The electro-optic gain and the system gain values are relatively stable. However, the offset may change over time due to drift, temperature changes and other causes. As a result, a fine offset calibration is performed during normal operation to increase the accuracy of the measurement.

A fine offset calibration is performed each time a response voltage signal is to be measured. During normal operation, respective response voltage signals are exposed to the corresponding dot contacts, a dot contact is selected for sampling, a fine offset calibration for the selected dot contact is performed, then an electro-optic voltage measurement is taken at the output of the A/D converter 76. Respective dot contacts are scanned with a fine offset calibration and signal measurement being performed for each dot contact each time the applied voltage signal is to be measured.

During each run time fine offset calibration, the optics system 70 is subjected to the above-described spin process to generate an electro-optically measured average signal. With the sample and hold circuit 246 in sample mode, the measured average voltage signal is adjusted to the average reference voltage signal level. Once the measured average voltage signal stabilizes, the offset signal C is the calibrated fine offset. The sample and hold circuit 246 then is switched to hold locking in the fine offset signal, and the spin process is terminated. Once spin is terminated the relative timing correlation between the test vectors and electro-optic sampling is restored. The A/D 76 output then can be sampled repeatedly to generate the electro-optically measured signal corresponding to the response voltage signal at the select dot contact. Accordingly, an unknown applied voltage signal of high frequency may be measured with excellent timing and signal amplitude accuracy.

Although a preferred embodiment of the invention has been illustrated and described, the invention may include alternative embodiments and changes. For example, although the time averaging for average referencing circuit is described as an RC network, other circuits for averaging the applied voltage signal over time also may used. This invention is applicable to stabilization of electro-optic measurement systems in general. Accordingly, the scope of the invention is not intended to be limited, except by the claims.

What is claimed is:

1. A method for electro-optically measuring an applied voltage signal received at an electro-optic measurement system, the electro-optic measurement system including means for sampling the applied voltage signal and means for averaging the applied voltage signal, the method comprising the steps:

fine offset calibrating the electro-optic measurement system by referencing an electro-optically obtained sample of the applied voltage signal to an electrical average of the applied voltage signal; and electro-optically sampling said applied voltage signal with a locked fine offset calibrating signal from the calibrated electro-optic measurement system to generate said electro-optically measured voltage signal.

2. The method of claim 1 in which the timing correlation between the generation of said applied voltage signal and said electro-optic sampling is alterable and in which the step of fine offset calibrating comprises the steps:

generating an average reference voltage signal from said applied voltage signal;
electro-optically sampling the applied voltage signal;
randomizing the timing correlation between the generation and sampling of said applied voltage signal;

referencing said sampled signal to said reference signal to generate a calibrated fine offset signal; and restoring the timing correlation between the generation and sampling of said applied voltage signal.

3. A method for electro-optically measuring a voltage signal in an electro-optic measurement system having an electro-optic crystal, said crystal having a plurality of dot contacts, each said dot contact having a reflective surface in contact with said crystal, wherein a laser beam passes through said crystal to one of said dot contacts for electro-optically sampling a signal from said one of said dot contacts, said one of said dot contacts altering the laser beam polarization in proportion to the voltage level of an applied input voltage signal at said one of said dot contacts, the method comprising the steps:

selecting a dot contact as said one of said dot contacts;

generating an applied voltage signal at said selected dot contact;

fine offset calibrating the electro-optic measurement system for the selected dot contact by referencing an electro-optic sample of the applied voltage signal to an electrical average of the applied voltage signal; and electro-optically sampling a selected signal from said selected dot contact with a locked fine offset calibrating signal from the calibrated electro-optic system to generate said electro-optically measured voltage signal.

4. The method of claim 3 in which the timing correlation between the generation of said applied voltage signal and said electro-optic sampling is alterable and in which the step of fine offset calibrating comprises the steps:

generating an average reference voltage signal from said applied voltage signal at said selected dot contact;

electro-optically sampling the applied voltage signal at said selected dot contact;

randomizing the timing correlation between the generation and sampling of said applied voltage signal;

referencing said sampled signal to said reference signal to generate a calibrated fine offset signal; and restoring the timing correlation between the generation and sampling of said applied voltage signal.

5. The method of claim 4 further comprising the steps:

waiting for the electro-optically sampled signal to stabilize while said timing is randomized; and locking in said fine offset signal after stabilization as the calibrated fine offset signal.

6. A method of electro-optically measuring a voltage signal in an electro-optic measurement system having an electro-optic crystal, a detector for detecting the polarization of a laser beam, and a signal averaging means, said crystal having a plurality of dot contacts, each said dot contact having a reflective surface in contact with said crystal, wherein a laser beam passes through said crystal to one of said dot contacts to electro-optically sample said one of said dot contacts, said one of said dot contacts altering the laser beam polarization in proportion to the voltage level of an applied input voltage signal at said open of said to contacts, said one of said dot contacts reflecting the laser beam back through said crystal to said detector which generates in response an electro-optic voltage signal proportional to the polarization of said reflected laser beam, said detector receiving an offset signal, the method comprising the steps:

selecting a dot contact as said one of said dot contacts;

generating an applied voltage signal at said selected dot contact;

generating an average reference voltage signal from said applied voltage signal at said selected dot contact;

electro-optically sampling the applied voltage signal at said selected dot contact;

randomizing the timing correlation between the generation and sampling of said applied voltage signal;

referencing said sampled signal to said average reference voltage signal to generate said offset signal;

applying said offset signal to said detector to calibrate the electro-optic sampling;

restoring the timing correlation between the generation and sampling of said applied voltage signal; and electro-optically sampling said applied voltage signal again following calibration to generate said electro-optically measured voltage signal.

7. An electro-optic measurement apparatus for measurement an input voltage signal applied to a pin of a device under test to generate an electro-optic output signal, comprising:

an electro-optic crystal electrically coupled to said pin of the device under test;

means for electro-optically sampling said pin applied voltage through said crystal to generate a sampled voltage signal;

means for generating an electro-optic voltage signal in response to a fine offset signal and said sampled voltage signal;

means for averaging said applied voltage signal to generate an average reference voltage signal;

means for generating an offset signal from said generated electro-optic voltage signal and said average reference signal;

means for applying said offset signal to said electro-optic voltage generating means as said fine offset signal.

8. The apparatus of claim 7 further comprising means for randomizing the timing between the applied voltage signal and the electro-optically measured voltage to enable said generated offset signal to stabilize.

9. The apparatus of claim 7 in which said averaging means comprises:

a plurality of high impedance resistor means, each of said resistor means connected to a corresponding dot contact, said applied voltage signal at said on of said dot contacts being input to a corresponding one of said high impedance resistors;

means for multiplexing said resistor means to select a sampled channel, said sampled channel comprising said one of said resistors; and capacitance means coupled to the resistor means of said sampled channel to generate a time-averaged reference signal, said time-averaged reference signal coupled to said offset signal generating means as said average reference signal.

10. The apparatus of claim 7 in which said electro-optic voltage signal generating means comprises a pair of differential detectors and a comparing means, said differential detectors receiving a reflected laser beam to generate respective electro-optic voltage signals, said respective electro-optic voltage signals input to said comparing means along with said fine offset signal to generate a responsive electro-optic voltage signal which is proportional to the polarization of the reflected laser beam, said responsive electro-optic signal coupled to said offset signal generating means as said generated electro-optic voltage signal.

11. An electro-optic measurement apparatus for measuring an applied input voltage signal to generate an electro-optic output signal, comprising:

an electro-optic crystal having a plurality of dot contacts, each dot contact having a reflective surface;

means for directing a laser beam through said crystal to one of said plurality of dot contacts, wherein the directed laser beam is of one polarization and the reflected laser beam polarization is altered in proportion to the voltage level of an applied voltage input signal at said one of said dot contacts;

means for generating in response to a fine offset signal and said reflected laser beam, an electro-optic voltage signal proportional to the polarization of said reflected laser beam;

means for averaging said applied voltage signal to generate an average reference voltage signal;

means for generating an offset signal from said generated electro-optic voltage signal and said average reference signal;

means for holding said offset signal upon stabilization of said offset signal, said held offset signal input to said electro-optic voltage generating means as said fine offset signal.

12. The apparatus of claim 11 further comprising means for randomizing the timing between the applied voltage signal and the electro-optically measured voltage to enable said generated offset signal to stabilize.

13. The apparatus of claim 11 in which said averaging means comprises:

a plurality of high impedance resistor means, each of said resistor means connected to a corresponding dot contact, said applied voltage signal at said on of said dot contacts being input to a corresponding one of said high impedance resistors;

means for multiplexing said resistor means to select a sampled channel, said sampled channel comprising said one of said resistors; and capacitance means coupled to the resistor means of said sampled channel to generate a time-averaged reference signal, said time-averaged reference signal coupled to said offset signal generating means as said average reference signal.

14. The apparatus of claim 11 in which said electro-optic voltage signal generating means comprises a pair of differential detectors and a comparing means, said differential detectors receiving a reflected laser beam to generate respective electro-optic voltage signals, said respective electro-optic voltage signals input to said comparing means allowing with said fine offset signal to generate a responsive electro-optic voltage signal which is proportional to the polarization of the reflected laser beam, said responsive electro-optic signal coupled to said offset signal generating means as said generated electro-optic voltage signal.

15. An electro-optic measurement apparatus for measuring an applied input voltage signal to generate an electro-optic output signal, comprising:

an electro-optic crystal having a plurality of dot contacts, each dot contact having a reflective surface;

means for directing a laser beam through said crystal to one of said plurality of dot contacts which reflects said laser beam, wherein the directed laser beam is of one polarization and the reflected laser beam polarization is altered in proportion to the voltage level of an applied voltage input signal at said one of said dot contacts;

means for generating in response to a fine offset signal and said reflected laser beam, an electro-optic voltage signal proportional to the polarization of said reflected laser beam;

integrating means having a first input channel, a second input channel and an output channel, said first input channel receiving said electro-optic voltage signal;

means for averaging said applied voltage signal to generate an average reference voltage signal which is input to said second input channel of said integrating means, said integrating means generating an offset signal at said output channel in response to said electro-optic voltage signal and said reference signal;

sample and hold means receiving said offset signal for sampling or holding said offset signal and outputting the sampled or held offset signal to said generating means as said fine offset signal;

timing control means for selecting the sample and hold modes of the sample and hold means and for controlling the relative timing between the applied voltage signal and the generation of the responsive electro-optic voltage signal;

wherein said fine offset signal is calibrated during a sample mode in which the relative timing of the applied voltage signal and the sampled electro-optic voltage signal is randomized so that the generated electro-optic voltage signal is an average electro-optic voltage signal, the average electro-optic signal being referenced to said average reference voltage at said integrating means to stabilize at said average reference voltage, the offset signal during stabilization defining a calibrated fine offset signal, said calibrated fine offset signal being locked in by switching to said hold mode, said relative timing being restored after calibration, said generating means generating said electro-optic output signal in response to said calibrated fine offset value and said reflected laser beam.

16. The apparatus of claim 15 further comprising programmable means for applying a gain to said average reference signal to generate a gain-adjusted time-averaged reference signal as the reference signal coupled to said second input channel of said integrating means.

17. A method of calibrating an electro-optic measurement system having a first and second electro-optic crystal and a sampling means, said second crystal having a plurality of dot contacts, each said dot contact having a reflective surface in contact with said second crystal, a laser beams passing through said first and second crystals to one of said dot contacts, said one of said dot contacts altering the laser beam polarization in proportion to the voltage level of an applied voltage signal at said one of said dot contacts, said one of said dot contacts reflecting the laser beam back through said second crystal and said first crystal to said sampling means which generates in response an electro-optic difference signal proportional to the polarization of said reflected laser beam, said sampling means having an offset signal input, the method comprising the steps:

calibrating a respective coarse offset voltage for each dot contact, said coarse offset to be applied to said first crystal;

calibrating an electro-optic gain for each dot contact location; and calibrating a run time fine offset signal to be the offset signal input to said sampling means.

18. The method of claim 17 in which the step of performing a run time fine offset calibration comprises the steps:

generating an average reference voltage signal from said applied voltage signal at said selected dot contact;

electro-optically sampling the applied voltage signal at said selected dot contact;

randomizing the timing correlation between the generation and sampling of said applied voltage signal;

referencing said sampled signal to said reference signal to generate a calibrated fine offset signal; and restoring the timing correlation between the generation and sampling of said applied voltage signal.

19. The method of claim 18 further comprising the steps:

waiting for the electro-optic sampled signal to stabilize while said timing is randomized; and locking in said fine offset signal after stabilization as the calibrated fine offset signal.

20. The method of claim 17 in which the step of calibrating a coarse offset for each one of said dot contacts comprises the steps:

applying a ground signal to said sampling means as said offset signal;

applying a ground signal to said one of said dot contacts;

applying a coarse offset signal of appropriate value to said first crystal to achieve a ground signal level for said electro-optically measured signal; and storing said coarse offset signal.

21. The method of claim 17 in which the step of calibrating an electro-optic gain for each one of said dot contact locations, comprises the steps:

applying a ground signal to said sampling means as said offset signal;

applying a ground signal to said one of said dot contacts;

applying the respective coarse offset voltage to said first crystal for said one of said dot contacts;

applying a first voltage to said second crystal and measuring the responsive electro-optically measured signal;

applying a second voltage to said second crystal and measuring the responsive electro-optically measured signal;

determining the electro-optic gain for said one of said dot contact locations as the difference between said first voltage and said second voltage divided by the difference between the responsive electro-optic difference signals;

storing said electro-optic gain.

* * * * *